United States Patent
Draving et al.

(10) Patent No.: US 7,248,982 B1
(45) Date of Patent: Jul. 24, 2007

(54) FINDING DATA DEPENDENT JITTER WITH A DDJ CALCULATOR CONFIGURED BY REGRESSION

(75) Inventors: Steven D Draving, Colorado Springs, CO (US); Allen Montijo, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/479,414

(22) Filed: Jun. 29, 2006

(51) Int. Cl.
*G01R 29/26* (2006.01)
*H04Q 1/20* (2006.01)

(52) U.S. Cl. .......................... 702/69; 375/226

(58) Field of Classification Search ............... 702/69, 702/71, 73, 74, 76, 79, 182, 183, 185, 190, 702/191, 108; 375/224, 226, 227, 371; 324/620, 324/621; 370/22, 76
See application file for complete search history.

(56) References Cited

U.S. PATENT DOCUMENTS

2006/0093027 A1* 5/2006 Draving et al. ............. 375/226
2006/0251200 A1* 11/2006 Miller ......................... 375/371

* cited by examiner

*Primary Examiner*—Bryan Bui

(57) ABSTRACT

Discovery of DDJ within measured Total Jitter (TJ) begins with a suitably long digital Test Pattern, from which an Acquisition Record is made. A Time Interval Error/Voltage Error Record is made of the Acquisition Record. A Template defines a collection of associated bit value or transitions that are nearby or otherwise related to a bit location of interest, and through the applied test pattern produces a sequence of Data Symbols. The TIE/VLE Record is examined, and a parameter is measured for each Data Symbol as it occurs in the Test Pattern. A regression technique may be use to find coefficients for a DDJ Calculator whose inputs are the Data Symbols and whose output is respective values of DDJ. Subsequent separation of DDJ from TJ is possible because DDJ is correlated with the Data Symbols, while Periodic Jitter (PJ) and Random Jitter (RJ) can be expected to average to near zero over a sufficient number of instances of a given Data Symbol.

24 Claims, 6 Drawing Sheets

FINDING DATA DEPENDENT JITTER WITH A DDJ CALCULATOR CONFIGURED BY REGRESSION

REFERENCE TO RELATED PATENT DOCUMENTS

The subject matter of this Patent is related to that of U.S. patent application Ser. No. 10/354,598 entitled CHARACTERIZING JITTER OF REPETITIVE PATTERNS filed 29 Jan. 2003 by Roger Lee Jungerman and assigned to Agilent Technologies, Inc. For the sake of brevity CHARACTERIZING JITTER OF REPETITIVE PATTERNS is hereby incorporated herein by reference. The subject matter of this Patent is also related to that of U.S. Pat. No. 6,898,535 entitled METHOD AND APPARATUS FOR DECOMPOSING SIGNAL JITTER USING MULTIPLE ACQUISITIONS filed 14 Aug. 2003 by Steven D. Draving and assigned to Agilent Technologies, Inc. For the sake of brevity METHOD AND APPARATUS FOR DECOMPOSING SIGNAL JITTER USING MULTIPLE ACQUISITIONS is also hereby incorporated herein by reference. The subject matter of this Patent is further related to that of U.S. patent application Ser. No. 10/929,194 entitled METHOD AND APPARATUS USE RE-SAMPLED TIE RECORDS TO CHARACTERIZE JITTER IN A DIGITAL SIGNAL filed 30 Aug. 2004 by Steven D. Draving and Allen Montijo and assigned to Agilent Technologies, Inc. For the sake of brevity METHOD AND APPARATUS USE RE-SAMPLED TIE RECORDS TO CHARACTERIZE JITTER IN A DIGITAL SIGNAL is also hereby incorporated herein by reference.

PLAN OF THE DESCRIPTION

This Patent is similar in subject matter to a US Patent Application entitled METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS, Ser. No. 10/978,103, filed 29 Oct. 2004 by Steven Draving and Allen Montijo and assigned to Agilent Technologies, Inc. In that prior Application a particular technique is used to discover Data Dependent Jitter, and a look-up table is used to codify the discovered results for ongoing use. The present case eschews the look-up table in favor of another technique that produces an adaptive filter. Given this similarity in the 'starting place,' we chose to rob the first dozen or so pages from METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS, and also its first three figures, and then repeat that here in somewhat condensed and streamlined form while also incorporating some necessary changes that steer toward the adaptive filter. The borrowed material essentially describes how the Data Dependent Jitter is discovered in the first place. Subsequent (new) material deals with an adaptive filter technique that is driven by that discovered data. As will become clear, the adaptive filter is not simply an exact 'drop-in' replacement for a (removed) look-up table. As for our 're-use' of METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS, it is true that an incorporation by reference might have, in principle, been used instead, but at the cost of great aggravation to the unfortunate reader. Imagine us here saying, "First go read columns 1-10 of . . . . , and then keep the notion of Templates, but merely note and then disregard the stuff about Descriptors and their Metrics, since instead . . . . " That would be gauche.

INTRODUCTION AND BACKGROUND

High speed digital systems rely on the ability to correctly ascertain the logical value of a binary data signal at specific times. In a digital system there are abrupt transitions between the logical values, and the nominal period of time that the data signal represents a particular logical value is called the UI (for Unit Interval). Generally there is provided (or derived) another signal, called a clock signal, whose period is also the UI and whose abrupt transitions in a selected direction serve as the 'specific times' (mentioned above) at which the logical value of the data signal is to be ascertained, a process often termed 'sampling.' It is common for the phase of the clock signal to be adjusted relative to the transitions in the data signal such that the sampling according to the clock signal will occur in the middle of the unit interval of the data signal. If satisfactory performance is to be achieved in a modern high speed system the error rate in sampling and ascertaining the logical values may need to be very low, often only one error in $10^{12}$ bits, or even less.

In an ideal world, all edges in a clock or data signal would occur at locations along a time axis that were an exact UI apart, or at exact multiples of the unit interval. The 'rattle' in the edges of a signal that is supposed to transition only at particular times (here, at the expiration of consecutive unit intervals) is called jitter. In today's high performance digital systems, the presence of jitter in the data signal and in the clock has a significant effect on the system's ability to correctly ascertain the logical value of the data signal. There are other error causing mechanisms, to be sure, but if a high speed digital system is to offer good performance it needs to have low jitter (say, $\frac{1}{1000}$ UI RMS, or less).

To reduce jitter one generally has to locate its source, and it turns out that it is useful and productive to recognize several different types of jitter. It is now common for test equipment intended for use with high performance digital systems to include in their repertoire of operations automated measurements of jitter, and to do so while recognizing several different types of jitter, each of which can be separately characterized. Total Jitter is the aggregate amount of observable jitter, and is (or ought to be) the 'sum' of all the various types of component jitter that can be recognized.

There are wide variations among techniques for jitter measurement. In particular, there are some 'brute force' techniques that perform all of N-many trials, and which can seem to take forever (hours, or even days!) to get accurate results having resolution in parts in $10^{12}$. Even if the $10^{12}$ is one nanosecond, it still takes over twenty minutes to measure $10^{12}$ of them. And some techniques require N-many repetitions of a suitable test pattern that is in the range of one hundred or a thousand UI in length. Clearly, such brute force approaches are not suitable for quickly characterizing expected low rates of jitter.

Various strategies have been developed to cope with this situation. These often revolve around assuming that some of the jitter is random in nature, with the rest arising from various other mechanisms. The idea is that, if the nature of a component source of jitter is known, then it can be represented by a suitable model. The significance of this is that, while the model needs coefficients to produce greater or lesser amounts of jitter, the shape of the probability distribution of that jitter component is specific to the model, so that the particular coefficients for a specific instance can be found by curve fitting techniques operating on a proper collection of samples. The plan (for, say, Random Jitter) is to sample for a reasonable amount of time, do a curve fit to instantiate the model, and then let the model predict with some confidence what we would get if we let the measurement run to conclusion using brute force techniques. Clearly, if that is the plan, then we need to have at hand data that represents only that one kind of jitter; otherwise the model's prediction will be inaccurate.

Now a new set of difficulties arises. The measured data will contain the effects of all the different types of jitter. These include Periodic Jitter, Random Jitter and Data Dependent Jitter that is correlated with the content of the data itself. It is not possible to readily directly measure samples that pertain to only a particular component type of jitter, since we can't observe those types in isolation: the measured data will generally include the combined effects of all types of jitter. Not only must indirect methods be developed to separate from the combined result the data for individual types of jitter (so that models or other analysis can be applied to appropriate data), but there is more than one way to decompose into components the combined jitter that is actually measured.

We are particularly interested here in a jitter measurement technique for discovering DDJ (Data Dependent Jitter) and that is useable in a real time Digital Sampling Oscilloscope (DSO) or comparable environment (such as a Timing Analyzer) to produce credible and valid results in seconds instead of hours. While there are various techniques that are known for measuring Total Jitter and separating out Data Dependent Jitter, each suffers from some disadvantage. For example, one technique operates quickly, but does not preserve observed frequency information for Periodic Jitter, which is useful diagnostic information for an attempt to eliminate such jitter. As a second example, another technique does not readily allow the combining of multiple measurements to obtain a more accurate answer. Still another disadvantage of some conventional techniques is that they require repetitions of a particular test signal, and may not accommodate an arbitrarily long test sequence.

The measurement technique described in METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS records discovered values for DDJ in an LUT (Look-Up Table) indexed by 'Data Symbols' described in an appropriate format. While this is a generally easy to appreciate approach, it has some disadvantages. The first of these is the size of the LUT itself. For each entry in the table there are whatever number of bytes are needed to express a value of DDJ, say, something equivalent to six to eight characters of scientific notation. Now we ask how many addresses are needed for the LUT (i.e., how many different instances of 'Data Symbols' are needed as indexes into the table). While there might be just a few bits needed for this, say four to six, it might also be ten or twelve, or even more. So, from one measurement setting to the next the size of the needed LUT might vary from fairly small to fairly large. This makes for an awkward memory management situation for supervisory processes in the jitter measurement system. Second, the actual DDJ discovery technique we are interested in has a minor wart in that, since it runs 'fast' (in seconds or minutes versus hours or days) it may not be exposed to all of the random variations that are apt to occur over a longer (but undesirable) measurement period. The effect of this is that Data Symbols that occur infrequently experience less self-cancellation for Random Jitter. Lastly, it is difficult to examine the entries of the LUT and learn useful things about the nature of the DDJ it represents, which, if they were known, might help identify its cause and alleviate that DDJ.

There is a need for a Data Dependent Jitter measurement technique using a real time DSO or Timing Analyzer that operates quickly, preserves useful ancillary information, whose resolution scales with longer measurement times, and that tolerates a test sequence of arbitrary length and content that might either be random or be actual 'live' data measured while the system was in operational use. It should also be able to measure not only the timing jitter of edges in the signal, but also characterize voltage variations exhibited in the asserted logic levels (HIGH/LOW, TRUE/FALSE). The essence of the DDJ discovery technique described in METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS meets these needs, but the LUT method of reporting measurement results (whether for initial discovery based on either test or live data, or for an instance of subsequent data applied against the LUT after its content has been finalized) has the disadvantages recited above. We need a different manner of associating the discovered DDJ data with Data Symbols as they occur. What to do?

SIMPLIFIED DESCRIPTION

Measurement, separation and analysis of DDJ in a System Under Test begins with the production of a suitably long digital arbitrary Test Pattern which may contain a random sequence of bit values, or, which might be actual live data. An Acquisition Record describing the sequence of logical values along a time axis is made of the entire arbitrary test pattern. For analysis of timing jitter, a complete Time Interval Error (TIE) Record is made from an inspection of the locations of the edges in the Acquisition Record. Analysis of voltage jitter (noise) is possible for Acquisition Records that are reconstructions of the actual analog behavior of the Test Pattern. To accommodate that analysis a Voltage Level Error (VLE) Record is created that is comparable to a TIE Record.

A user of a jitter analyzer defines a Template (or 'Data Symbol') that is a collection of associated bit behaviors at bit locations that are nearby or otherwise related to a (reference) bit location of interest, but whose locations need not be contiguous or adjacent. A Template can be defined as either bit values or as transitions. It will be convenient to associate an edge or transition with the bit location that follows it. This will allow us to adopt a less cumbersome terminology that embraces both bit values and transitions. So, our 'bit behaviors at bit locations' are either bit values or transitions, or, perhaps a mixture of both. Examples of a Template might be the two bit values (or transitions) before and the two bit values (or transitions) after the bit value (or transition) of interest, or, the three bit values (or transitions) prior to the one of interest. The nature of the expected source of jitter may influence the nature of the Template. An electrical structure involving a transmission line that is inducing DDJ by causing reflections might use a Template having groups of one or several bits where the groups are separated by a number of bit positions; the accumulated Unit Intervals for the separating bit positions is related to the propagation velocity along the transmission line and the length thereof to a discontinuity causing a reflection.

In METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS we said that a Template has associated therewith a collection of Descriptors and their respective Metrics. Each Descriptor was one of the various different patterns of bit values (or transitions) that fit the Template. The complete TIE Record was examined in conjunction with a reconstructed Acquisition Record for the actual waveform of the Test Pattern, and the various instances of the same Descriptor noted in the reconstructed waveform, for each of the various different Descriptors. A parameter associated with the Template was measured from the TIE Record for each instance of each Descriptor in the Template. For example, the signed amount of TIE for the bit position of interest that locates the position of the Template along the waveform might be such a parameter. The collection of measured parameters for each particular Descriptor were combined (e.g., averaging) to produce the Metric for that Descriptor. The Descriptors addressed the LUT and the Metrics (values for DDJ) were the content at the addressed locations.

In the present technique we never bother to note the occurrences of the individual Descriptors, nor set out to separately produce their Metrics so that they may be stored. Instead, a linear regression process (a Regression Calculator) finds coefficients for use with a DDJ Calculator. The then configured DDJ Calculator is subsequently 'continuously' driven by the actual sequence of bits in the data for the entire Test Pattern (but the bit positions observed relative to the 'current bit' are those selected by the chosen Template), and by the instance of measured (but un-averaged!) parameter value associated with that 'current bit'. The regression finds the relationship between independent variables of Template-related bit values (whose various combinations were formerly called the Descriptors) and the dependent variable of DDJ (which corresponds to the averaged parameter values which were called Metrics). The output of the configured DDJ Calculator is a sequence of DDJ values that respectively correspond (perhaps through some delay) to the sequence of observed data position bit values (to avoid confusion with Descriptors, let's call those various different combinations of bit values 'Data Symbols') that were the input to the DDJ Calculator. The DDJ Calculation mechanism itself can be implemented as would be for a FIR (Finite Impulse Response) Filter, which, of course, can be accomplished with either actual hardware (which runs fast) or in software (more flexible, cheaper, but not as fast).

Just as with an LUT, such a DDJ Calculator can be used to separate Total Jitter (TJ) into one portion that is Data Dependent Jitter (DDJ) and into another portion that is Periodic Jitter (PJ) convolved with Random Jitter (RJ). The separation works because: (1) Total Jitter is the 'sum' of those two portions and no others; and (2) DDJ is correlated with the Data Symbols, while PJ and RJ (and thus also their convolution) can be expected to average to near zero over a sufficient number of instances of a given Data Symbol. That condition of 'self-cancellation' can be expected to obtain if the test pattern is long compared to the size of the Template. Once the DDJ Calculator is created a plausible value of DDJ can be imputed to each bit position in the test pattern by applying the ongoing sequence of bits (according to the Template in use) to that DDJ Calculator. DDJ for timing jitter involves using bit positions that have edges, while DDJ for voltage noise does not require that there be an edge at a bit position. The identified instances of DDJ can then be individually removed from the corresponding locations of the original TIE/VLE Record for the measured TJ to produce an Adjusted TIE/VLE Record representing PJ convolved with RJ, and conventional techniques may then be used to perform further separation and analysis for that jitter present in the remaining difference.

Unlike an LUT, however, a DDJ Calculator implemented in software requires but a modest amount of memory to implement, and exhibits much less variation in size from one measurement setting to the next. (Even a hardware version is not 'big' as special purpose calculation mechanisms go.) Next, the nature of the DDJ Calculator (which is, after all, a type of filter) is such that Data Symbols that occur with lesser frequencies continue to receive some benefit for self-cancellation of Random Jitter. That is, the continuous nature (think: 'smooth shape') of the filtering aspect of the DDJ Calculator (as influenced by the regression technique used to find its coefficients) allows the more frequently occurring neighbors of an infrequent Data Symbol to influence the result for the less frequently occurring entry. It is as if the self-cancellation of Random Jitter becomes more of a 'community property' that is 'shared' among all Data Symbols, whether they occur frequently or infrequently. Lastly, an examination of the coefficients of the DDJ-Calculator-As-FIR-Filter can reveal its shape, which can provide insight into what is causing the DDJ it describes.

DETAILED DESCRIPTION

Figure 1:
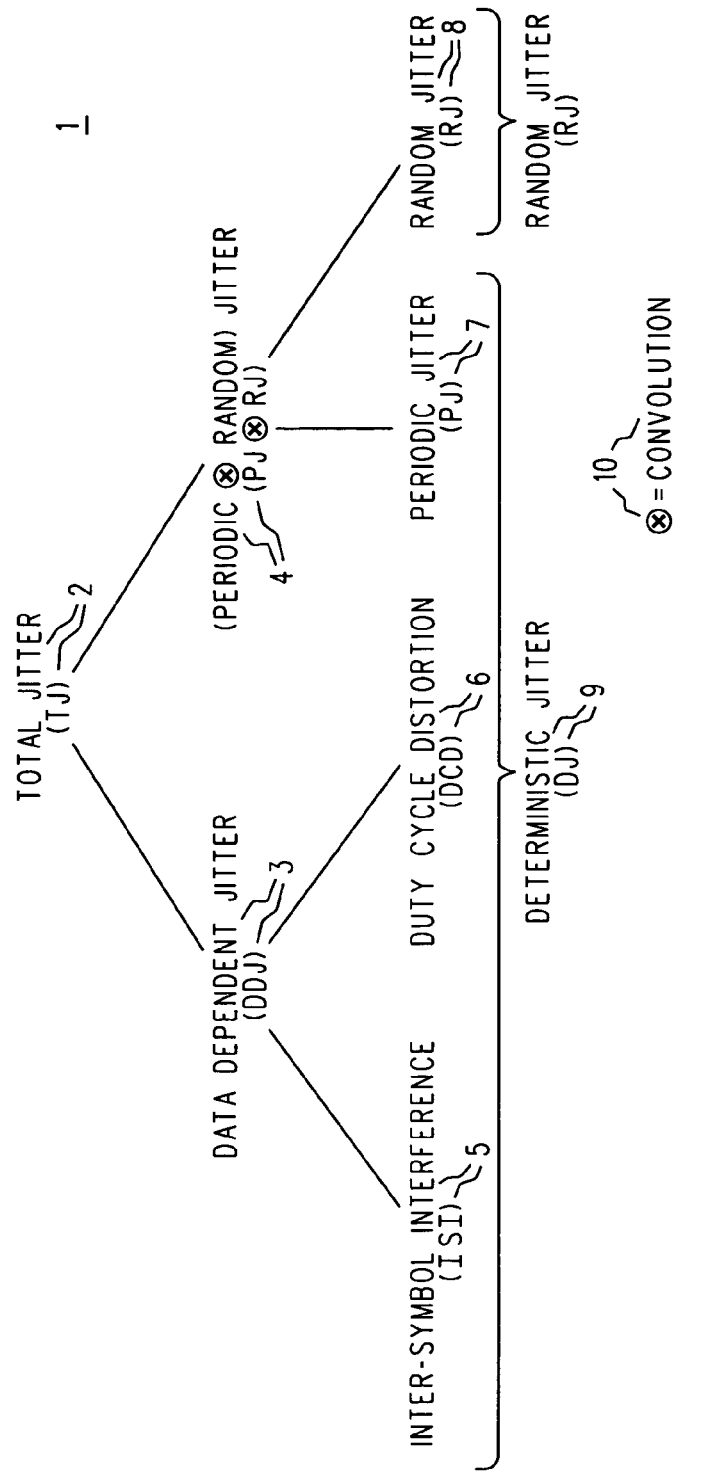
FIG. 1 is a prior art diagram illustrating a preferred manner of decomposing total jitter into deterministic jitter and random jitter.

Refer now to FIG. 1, wherein are shown some relationships between the various types of jitter with which we shall be concerned. FIG. 1 is a diagram 1 describing a paradigm we shall use in understanding jitter. It begins at the top with the notion that there is something called TJ (Total Jitter) 2. It represents all the aggregate jitter that is present in the system being measured. It is the thing that, while in principle can be measured by direct observation, takes too long to discover by such a brute force method. It will be appreciated that wherever we use the term 'jitter' it applies to either timing jitter or voltage jitter (noise), unless there is, either specifically or through the context, an indication that only one or the other is meant.

In the paradigm of FIG. 1, TJ 2 is composed exactly of two component parts, one of which we call DDJ 3 (Data Dependent Jitter) and the other of which is the combination (4) of PJ⊗RJ. This combination 4 is of Periodic Jitter (PJ) 7 convolved with Random Jitter (RJ) 8. Note that both representations describe probability density functions. This leads us to the observation, which will be familiar to those who operate with probabilities, that the proper method of combining, or summing, two probability density functions such as 7 and 8 is convolution, which operation is indicated by the symbol ⊗ (10).

RJ 8 is assumed to arise for inescapable natural reasons, after the fashion of thermal noise or quantum effects, and is further assumed to be Gaussian in nature. PJ 7 is jitter that has a strong periodic content, say, for example, that a strong periodic signal from another system is coupled via cross talk into the system being measured. It might have no correlation whatsoever to the SUT (System Under Test), but is nevertheless regular. And while the presence of PJ in our paradigm allows for this sort of thing, we don't demand that it actually be there. That is, in some SUTs there might not be any detectable PJ.

The other component of TJ 2 is DDJ 3. This is jitter that is caused by, or is correlated with, the particular patterns of bits in the data being transmitted. It turns out that there are mechanisms that allow what has already been sent, or that will be sent, to affect the reception of the bit currently being received. ('Already been sent' seems benign enough; perhaps local heating or cooling related to certain activity in the data disturbs thresholds or alters rise or fall times. But 'will be sent' might seems as if it requires an effect to precede its cause. Not to worry. The idea is that a complex transmitting mechanism, such as a SERDES, say, has a highly pipelined parallel architecture with busses interconnecting FIFOs and registers all susceptible to cross talk, and that the complex transmitting mechanism DOES ALREADY CONTAIN the evil data that is the 'cause.' That data just hasn't been sent yet over the transmission path to the receiver, and the jitter will get into the data as it is sent. Thus, causation still precedes its effect, and no mysterious metaphysics is required.) Since these phenomena are already reported in the literature, we needn't dwell on them further. One measure of such DDJ is ISI 5 (Inter-Symbol Interference) and another is DCD 6 (Duty Cycle Distortion). Those seeking further information about these measures of jitter are referred to the incorporated Patent Applications and the product literature cited in the incorporated METHOD AND APPARATUS USE RE-SAMPLED TIE RECORDS TO CHARACTERIZE JITTER IN A DIGITAL SIGNAL.

Finally, we group ISI, DCD and PJ together as DJ 9 (Deterministic Jitter). It will be appreciated that while the DDJ portion of DJ is separable into ISI and DCD, those components are not necessarily independent nor mutually exclusive, and they generally do not combine by convolution. In any event, the intent of this grouping is that DJ 9 is all jitter that is not truly random in nature (RJ, 8), but that is either somehow correlated with the data, or is downright periodic, which in neither case fits our intuitive notion of 'random.' An important difference between RJ and DJ is that RJ has (in principle) a PDF (Probability Density Function) with an infinite domain, while DJ has a PDF whose domain is bounded.

Figure 2:
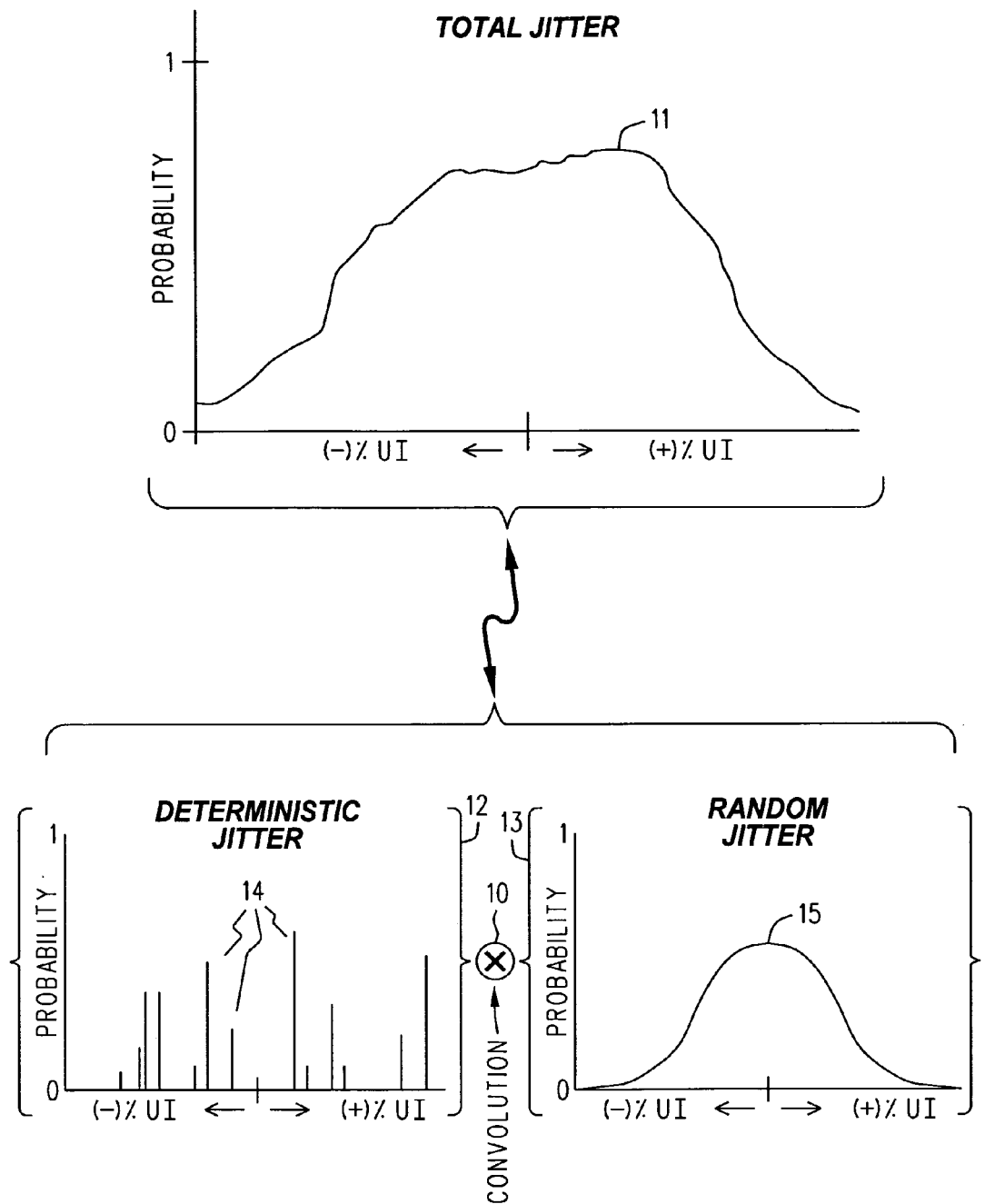
FIG. 2 is a prior art diagram illustrating that a histogram representing total jitter can be decomposed into separate probability distributions representing deterministic jitter and random jitter.

Refer now to FIG. 2, wherein is shown a histogram 11 representative of Total Jitter. Total jitter is the actual aggregate amount of jitter the system exhibits, from whatever source. It is what is directly measurable, although it generally takes way too long to do so directly for the small amounts of jitter that are at present considered reasonable. Histogram 11 is not one that has been directly obtained by brute force measurements, although suppose for a moment that it is. Such a histogram is indeed an item that we would like to have (even if we don't actually have it), and we are showing it (11) in the abstract and in the spirit of saying "Well, there exists some histogram that describes the total jitter, and let's suppose that this (11) is it." It is a histogram of probability versus percent error in UI. That is, the amounts of jitter, while they could be described as absolute times, are instead described as position errors that are early or late arrivals in terms of the UI. The probability axis represents the likelihood that an edge occurred with that amount of position error. Now, in this regard, it maybe tempting to think that the only possible errors are fractions of a UI. For some systems this would be a reasonable assumption. But we are operating at very high speeds for data streams of significant length. A slight drift in the data rate can accumulate errors to produce a transition location having more than a UI of error, when compared to the ideal correct time of signal transition.

To continue, then, our plan is to assert that there exists some histogram 11 describing Total Jitter, and argue that, whatever it is, that Total Jitter can be decomposed into Random Jitter and Deterministic Jitter. That is, we will assume that such a decomposition is a true partition of the Total Jitter: i.e., any type of jitter is either in one category or the other, and that none is in both. This leads us to assert that there is some representation 12 for Deterministic Jitter 9 that can be combined with a representation 13 for Random Jitter 8 that "adds up to" the histogram 11 for the Total Jitter. We note that we expect the Deterministic Jitter to usually be discrete and static, as indicated by the collection of spectra-like lines 14 (note we are not accusing them of being spectral components in the signal . . . just that their shapes resemble a displayed spectra). We also expect the Random Jitter to follow some plausible distribution found in nature, such as a Gaussian one represented by distribution 15.

Figure 3:
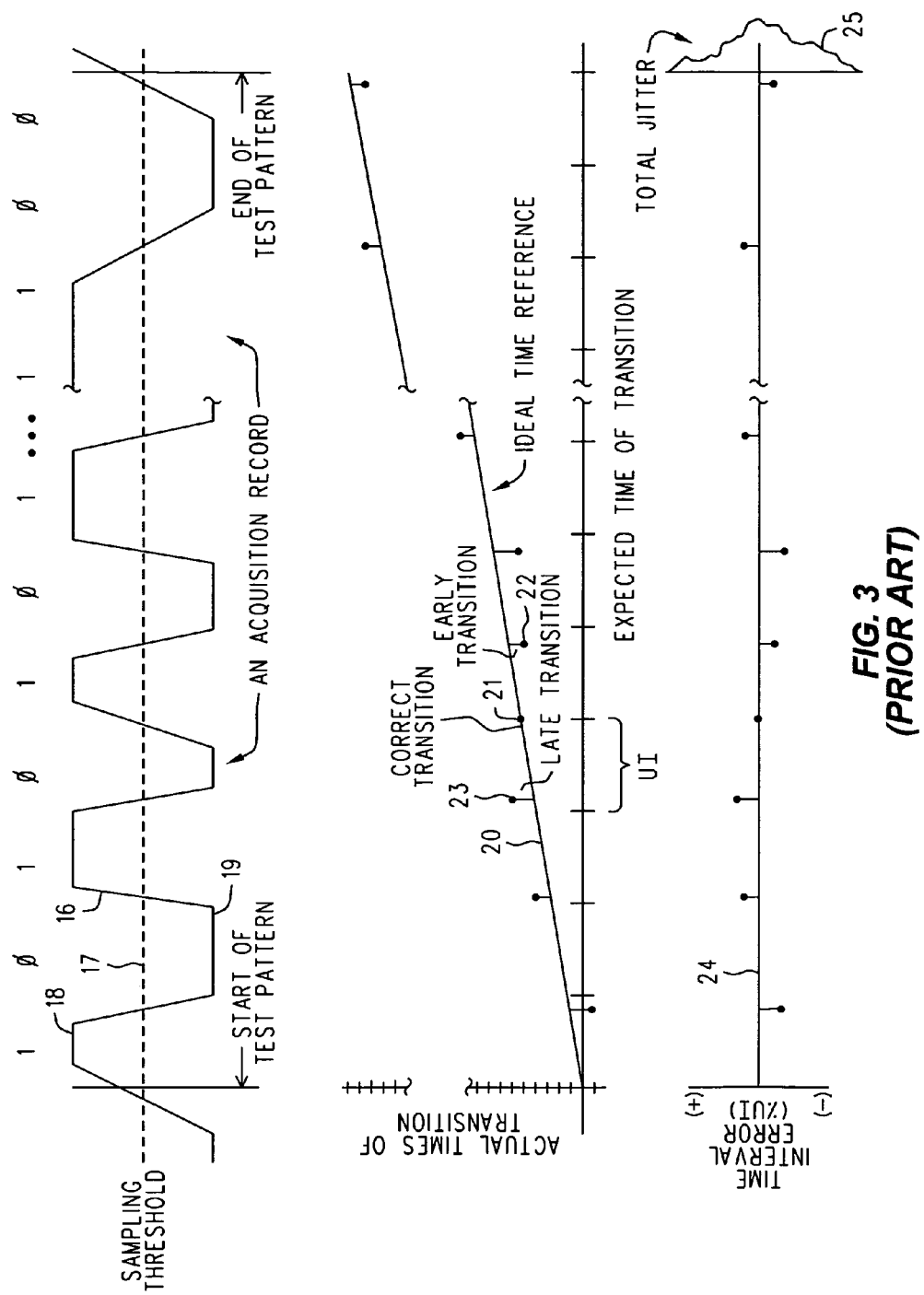
FIG. 3 is a prior art diagram illustrating the notion of a TIE Record for a Data Acquisition Record and a prior art histogram produced therefrom to estimate total jitter.

In FIG. 3 an acquired data waveform 16 is depicted, along with a threshold 17 against which the data waveform 16 is compared for determining the logical values of TRUE and FALSE in a test pattern. In this example, the portion 18 of data signal 1 conveys a logical value of TRUE (a logic ONE), while portion 19 conveys a logical value of FALSE (a logic ZERO). We are not in this figure indicating how the time variant waveform of the data signal 16 is measured. That can be done in different ways, depending upon the nature of the test equipment. As an example that we are interested in, a real time DSO would digitize discrete sampled locations of the waveform at known times therealong. (It will be appreciated that for high speed signals there may be only ten or less samples per cycle, but that this does not present a problem, since the 'scope relies on a DSP (Digital Signal Processing) implemented reconstruction filter protected by the Nyquist limit to 'fill in the dots.') In any event, the test equipment would ultimately have in its acquisition memory a data structure called an Acquisition Record that represents the waveform of the data signal. We also are not in this figure indicating how the logical pattern in use is discovered from the reconstructed waveform according to the relationship between the waveform of the data signal 16 and the threshold 17. The pattern might, by simple agreement, be known ahead of time. To enforce that might, however, be quite inconvenient. Post processing by the DSO of the Acquisition Record 1 can reveal the sequence of logical values it contains, should that be desirable (which for us it will be). Another possibility is coupling the input signal to an actual hardware comparator having an actual threshold that produces an actual collection of logical ONEs and ZEROs from time stamped transitions (which would be how a Timing Analyzer acquires data, and in which case there probably would not be any separate samples that need DSP).

To continue in the DSO case, the samples representing the Acquisition Record 16 can be processed with DSP techniques and/or interpolation to discover with suitable precision the locations along a time axis when an edge in the data signal crossed the threshold 17. With a correctly set threshold (very probably one set in the middle of the signal's voltage excursion), jitter, if it is present, will cause the time locations of the threshold crossings to vary from the ideal sequence of consecutive UIs. This is shown in the middle portion of the figure, wherein is depicted an ideal time reference line 20, appended to which are indications of correct (21), early (22) and late (23) transitions. The length of these appendages is indicative of the degree of error. It is clear that if a Timing Analyzer provided time stamped transition data (as opposed to a DSO's digitized samples), the same correct/early/late actual time of transition information can be produced.

The process of discovering the Time Interval Error for an edge involves knowledge of what the UI ought to be, and that information might arise from how a clock signal that is supplied by the SUT, or that is recovered from its data, exhibits a transition in a particular direction. It might involve the phase locking of a time base in the DSO or Timing Analyzer to one in the SUT, since even precision laboratory grade time bases that are independent can be expected to drift relative to one another by amounts that correspond to significant amounts of jitter in a high speed system.

As an aside, we wish to point out that, although FIG. 3 is drawn as though each ideal UI is expected to be the same length of time, this need not be the case. There are systems where the UI varies on purpose. If we were to measure jitter in such a system we would presumably be informed about the nature of such variations, and could still correctly determine the errors that occur. We might then normalize these errors to be expressed as a percentage of expected UI, so that the members of a collection of such transition data are commensurable.

The bottom portion of FIG. 3 is a representation of a TEE (Time Interval Error) Record 24 that is prepared from the information depicted in the parts of the figure already described. The TIE Record is a description of the observed jitter, and corresponds to total jitter. Upon reflection, it will be appreciated that such a TIE record 24 is, in terms of information content, superior to a histogram, such as 11 in FIG. 2, in that actual instances of jitter are still embedded in their surrounding circumstances. (This is not to impugn the utility of the histogram 11; it readily conveys useful information by its shape that remains concealed within a TIE record such as 24.) One prior art technique, described in the incorporated METHOD AND APPARATUS FOR DECOMPOSING SIGNAL JITTER USING MULTIPLE ACQUISITIONS constructs a histogram (25) from the TIE data, and then uses that histogram as the basis for a model from which to make estimates of other types of jitter.

Henceforth, when we refer to a TIE Record, we shall have in mind a data structure implemented in the memory of suitable test equipment, such as a real time DSO or Timing Analyzer, which contains time interval error information of the sort depicted in the lower third of FIG. 3 (although without the histogram at the right-hand end), and that has been derived from circumstances similar to those set out in the top two portions of that figure.

Figure 4A:
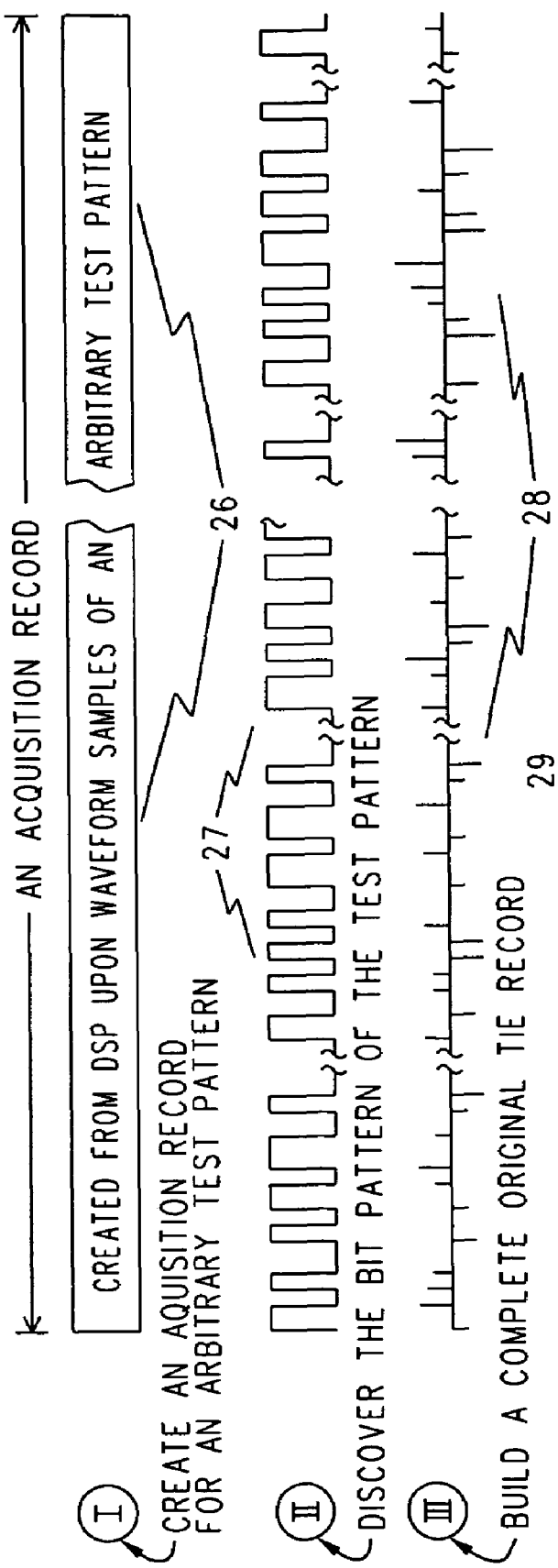
FIGS. 4A and 4B are a diagram illustrating the production of an Acquisition Record arising from the sampling of digitized values or the discovery of transitions through comparison against a threshold and the subsequent production therefrom of a collection of coefficients by a Regression Calculator that are then used to configure a DDJ Calculator driven by the data and that produces values of DDJ in accordance with a specified Template.

Now refer to FIGS. 4A & B, which comprise a diagram illustrating a series of steps that are performed in accordance with the principles of the invention to discover a description of DDJ, allow its use and subsequent removal from a description of measured TJ in pursuit of further analysis of PJ convolved with RJ. In Step I an arbitrary Test Pattern is represented in an Acquisition Record 26 as either consecutive samples meeting the Nyquist requirements or as consecutive directed transitions. This Acquisition Record 26 is created by a suitable measurement process, and is the basis for the jitter measurements to follow. The Test Pattern is, in principle, arbitrary, in that it may be random data, live data or some other favorite sequence of bits prized for some special property. What is really required is that the Test Pattern be 'long' in comparison to patterns that produce DDJ and that it include a reasonable and fair number of the various bit sequences in the data that the SUT is expected to cope with. Pseudo random data is usually ideal for this purpose, although it is believed that live data generally works about as well provided that a long enough Acquisition Record is obtained. It won't generally be harmful if the data includes lopsided distributions of particular bit patterns, so long as others that are of interest are present in sufficient respective instances to provide the necessary degree of self-cancellation for PJ and RJ. The technique to be described does not rely on the notion that all instances of self-cancellation are equally good (not even pseudo random data will always guarantee that); it only requires that the self-cancellation for each instance is 'good enough.'

In Step II the bit pattern 27 for the arbitrary Test Pattern is discovered, if it is not already known. For example, the discovery may be made in a real time DSO environment, where the Acquisition Record is consecutive digitized samples, by applying DSP to those samples to obtain a rendered result that is suitably dense and then comparing that against a threshold that is, say, midway between average maximum and average minimum values.

In Step III a complete Original TEE Record 28 is created from an inspection of the bit pattern produced in Step II. As described in connection with the bottom portion of FIG. 3, each edge in the Test Pattern gets a signed value that is the error in expected time of occurrence for that edge. Ascending lines indicate late transitions, descending lines represent early transitions, while in each case the length of the lines represents the amount of the error. A dot indicates a zero length line, and no error for the corresponding edge. Of course, the TIE Record is numerical data stored in a memory-based data structure, and is not actually stored as an image as is seen in the figure. (It will naturally be appreciated that the image in the figure is merely a convenient way to indicate the kind of information that is in the data structure.)

Now consider Step IV. Assuming that the user, or some other agency, has specified a Template that can be understood as a collection of either bit patterns or transitions in the Test Pattern, there will occur various Data Symbols in the Test Pattern that arise from the defined Template. As mentioned in the Simplified Description, examples of a Template might be the two bit values/transitions before and the two bit values/transitions after the bit value/transition of interest, or, the three bit values/transitions prior to the one of interest. The nature of the expected source of jitter may influence the nature of the Template. An electrical structure involving a transmission line that is causing reflections might use a Template having groups of one or several bits where the groups are separated by a number of bit positions, such that the accumulation of Unit Intervals for the separating bit positions is related to the length and propagation velocity along the transmission line. Each Data Symbol is one of the various different patterns of bit values/transitions that fit the Template. For example, the 'two before/at/two after' bit value Template can have thirty-two different ways that it can occur ('two before' plus 'two after' plus the one of interest that is 'at' is five two-valued bits, for $2^5=32$ different patterns). Upon reflection it will be appreciated that such a Template, when used for a voltage jitter (noise) measurement can indeed have all thirty-two different values. There can be voltage noise for the 'at' bit even when one or both adjacent bit locations have the same bit value as the 'at' bit (i.e., there is not an 'at' edge).

On the other hand, a timing jitter measurement for an 'at' bit requires that it have an edge (only an edge can undergo timing jitter!), which removes some bit patterns from the thirty-two. In particular, the one-one and zero-zero combinations of an 'at' bit and its predecessor would never be accompanied by an intervening edge. So, the usual factor of four that would ordinarily correspond to those two bits is replaced by a factor of only two: one for the one-zero combination plus one for the zero-one combination. This is a reduction by half, so in this example there will be at most sixteen Data Symbols that will be associated with actual timing jitter measurements.

Bit position transition information is three-valued (rising edge, falling edge, or no change) so a 'one on either side' transition Template could have at most $3^3=27$ different instantiations, although not all these are realizable, either, since two consecutive transitions in the same direction are not allowed in conventional two-valued (binary) digital systems. (It will be noted that any desired legitimate transition Template can also be expressed as a collection of one or more corresponding bit value Templates.)

The essence of Step IV is to find a discovered set of configuration coefficients (for a DDJ Calculator) from a regression (30) that is: (A) Performed on the sequence of individual Data Symbols occurring in the applied data (29), which could be either a fixed Test Pattern or actual live data captured and subsequently treated as if it were a deliberate Test Pattern; and that is (B) Considered in conjunction with the individual TIE values (28). An ideal Test Pattern would ensure that every Data Symbol occurred at least a sufficient number of times that self-cancellation would occur for Random Jitter, but even if it does not for some, or even if some Data Symbols fail to occur, this is not fatal, as the coefficients (31) found from the regression for the DDJ Calculator (33) will 'bridge' the gap through an 'automatic curve fitting' for the 'hole.' (Of course, Data Symbols that never occurred in the data are in fact probably worth reporting to the operator, as it suggests either that the Test Pattern is not robust or that the Template is overly ambitious . . . .)

Accordingly, in Step V we save in a memory 32 (or perhaps in a set of registers if the DDJ Calculator is implemented in hardware) the coefficients 31 found by the regression process 30.

In Step VI we apply the discovered coefficients to the DDJ Calculator (whose general form has been selected in advance—all it needs is its coefficients and an input string) and an input string (data whose DDJ is to be reported) that may be the Test Pattern (26) of the Acquisition Record, or, might instead be live data (34) from an SUT in actual operation.

It may well be that it is possible to fashion a computational mechanism to serve as the DDJ Calculator that is fast enough to operate at the data rate in use. If so, then after some latency as consecutive input data values 'fill up' the chain of sequential computations within the DDJ Calculator, computed DDJ values (35) will appear at the data rate. They will be just a little bit delayed in time. As an aid to some further analysis that probably starts with capturing what happened (a trace, as it were, of the DDJ versus the data) it may be desirable to apply a copy of the input to the DDJ Calculator to an optional delay mechanism 36 so that its output 37 can be paired in real time (albeit delayed) with the computed DDJ values 35, say, for capture in a memory (not shown).

Figure 5:
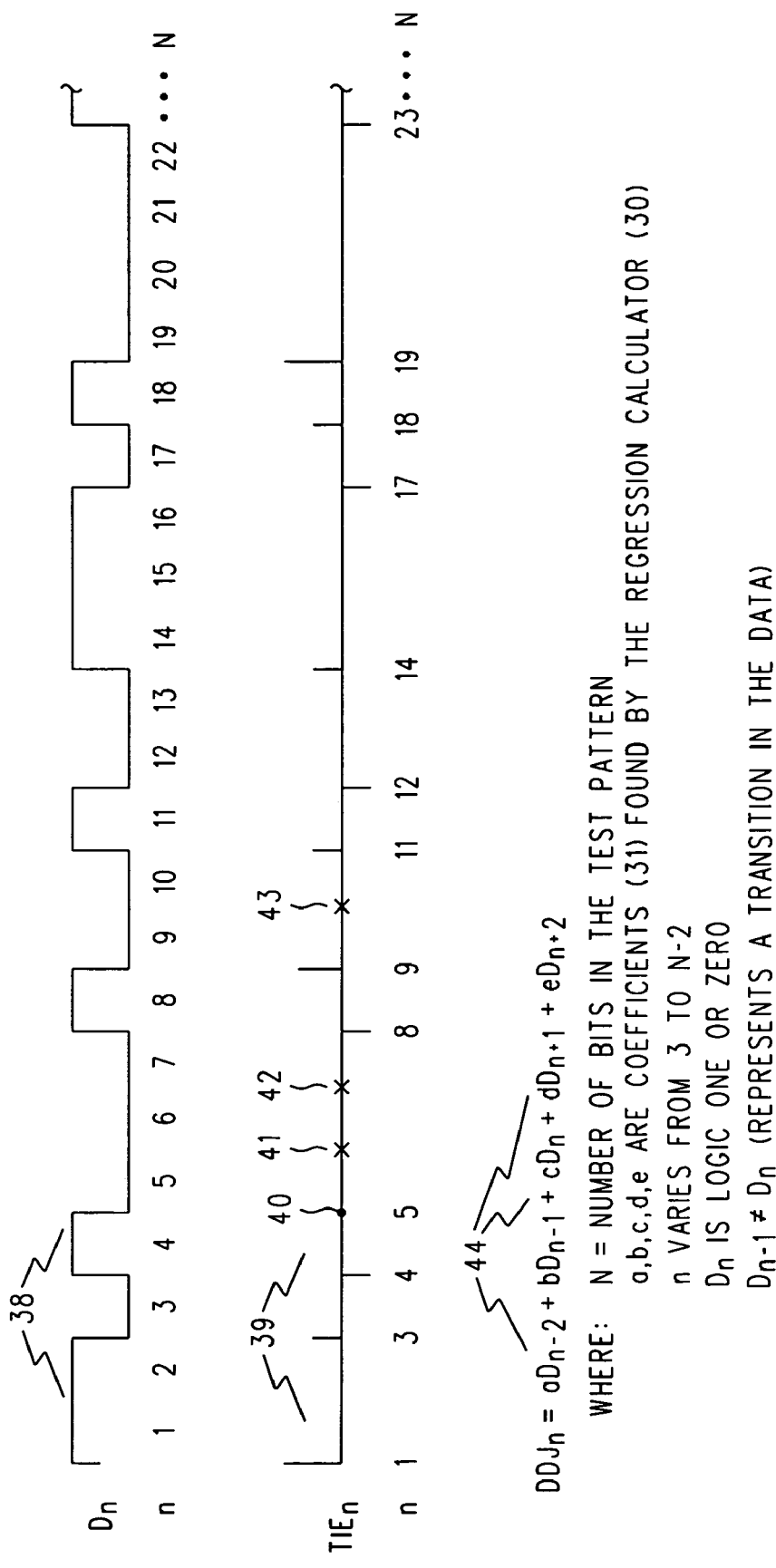
FIG. 5 is an illustration of a DDJ Calculator that is similar to an FIR Filter and that for a selected Template and using coefficients found by regression produces values for DDJ as the various bits in a sequence of data are applied thereto.

Now refer to FIG. 5. It is a diagram that helps explain the nature of the DDJ calculation performed by the DDJ Calculator 33. Consider data waveform 38, which may be derived from the Acquisition Record and corresponds to II (27) in FIG. 4A. It exhibits a series of N-many logic values $D_n$, each of which is the usual ONE or ZERO. Underneath the waveform 38 we have shown the ordinal values of the bit positions (n) of the waveform, which may be either a selected test pattern (say, of pseudo random bits) or actual live data. The ordinal n is assumed to begin at one, and increase to N.

The figure also depicts a TIE Record 39 identified as $TIE_n$. It corresponds to III (28) in FIG. 4A, and contains individual TIE values for the edges in data waveform 38. Since there are times in waveform 38 when logical values are repeated consecutively, there are locations (e.g., 41, 42, 43) that elsewhere we have called 'holes' caused by the lack of a transition in the data. If there is no transition, there can be no TIE value. At other locations of TIE record 39 the height and direction of the line segments at ordinals 1, 3, 4, 8, 9, etc., indicate the amount and direction in time of the TIE for the transition at those ordinal bit positions. Note that value 40 is a TIE of zero, and is not a hole.

The purpose of the figure is to set out the nature of the equation 44, for which waveforms 38 and 39, and their ordinals, are a useful adjunct. Equation 44 is a DDJ calculator that may be implemented in either hardware or software. Its structure resembles that of an FIR filter. The value $DDJ_n$ is the DDJ value for the $n^{th}$ bit $D_n$ in waveform 38. The coefficients a, b, c, d and e are those (31) found by the Regression Calculator 30. Each coefficient is associated with the logic value of a data bit, as indicated by the subscripts. In equation 44 the n is assumed to have a definite value, say, ninety-seven. That would mean that the value of DDJ for the ninety-seventh bit in the data was being found. Presumably, n would be ninety-eight for the next computation. It can be seen that any given value of $DDJ_n$ is simply the sum of one or more of the coefficients a-e (the other factor in each term is either just a one or a zero), so there are only a finite number of possible answers based only on addition and no multiplication. This lends itself to a high speed hardware implementation.

On the other hand, the example shown as equation 44 is rather specific to a particular template. In this example that template is the two bit locations immediately preceding the 'current' bit location and the two bit locations immediately after the current location. That is a total of five bit locations that are (in this case) consecutive. Since there are five bit locations there are five terms, and five coefficients (a-e). If the template did not imply consecutive locations, then whatever 'spacing' there was between the various bit locations would be reflected in corresponding changes in the subscripts of the D terms. So, for example, we might have following Template and $DDJ_n$ formal:

$$\$\$XXX\$nXX\$\$\$\$\$ (\$=\text{location of interest}, X=\text{skipped bit location})$$

$$DDJ_n = aD_{n-6} + bD_{n-5} + cD_{n-1} + dD_n + eD_{n+3} + fD_{n+4} + gD_{n+5} + hD_{n+6} + iD_{n+7}$$

This arrangement reflects a bit value oriented Template of nine bit locations: one preceding the current bit, two consecutive bits ending three locations ahead of that, the current bit itself, and four consecutive bit locations beginning after two skipped locations following the current bit. The nine coefficients are a-i.

The DDJ Calculator will provide a proper value for (timing) DDJ only when the bit location of interest represents a transition. That is, when $D_{n-1} \neq D_n$. This is neither surprising nor unreasonable, since it is somewhat metaphysical to consider the timing jitter in an edge that does not occur . . . .

It is also useful to consider the case where the Template is transition oriented. Associated with each bit position may be any one of three 'transition values.' These are Rising Edge, Falling Edge, and No Change, say, R, F and N at a location of interest n, leading us to write, for example, such things as $R_{n-3}$, $F_{n-2}$, $R_n$, $N_{n+4}$ and $F_{n+6}$. We can represent these values for computational purposes using either of two schemes. First, we could simply let R=+1, F=−1, and N=0. This manner of representation assumes that we need three different values for each bit position. Another way that also works is to imagine that each location is a pair of 'pseudo locations' and adopt some rules about what their values can be. One of the pair only ever experiences rising transitions, and the other only ever falling transitions. Only one of the pair can experience a transition at any one time. A '1' at either input indicates the associated transition, while a '0' indicates the absence of a transition. Thus, for a pair of such pseudo locations the values (0,0), (1,0), (0,1) are permissible, while (1,1) is not. To implement this technique we might maintain two Transition Records: one for Rising, and one for Falling. Either way works, although we see some advantages in the second (pseudo location) approach. One advantage is that it lends itself to into a partition of two separate sets of input variables, and while there are now more of them, the computational mechanisms needed remain just those for dealing with the various input variables having values of only one and zero, which is a welcome simplification. Another advantage is that since the DDJ Calculator now has more input variables, it will need more coefficients from the Regression Calculator. That is a good thing, as it increases the complexity with which the DDJ Calculator can model the DDJ, and these extra coefficients only have to be found once, even if there are more of them. So, for instance, it may be desirable to allow rising edges in some bit position in the Template to have more effect on DDJ than falling edges at that position. It can be shown that this sort of increased flexibility/complexity for the DDJ calculator is possible with the pseudo location approach, while it is not with the simple three-valued variable approach.

Figure 4B:
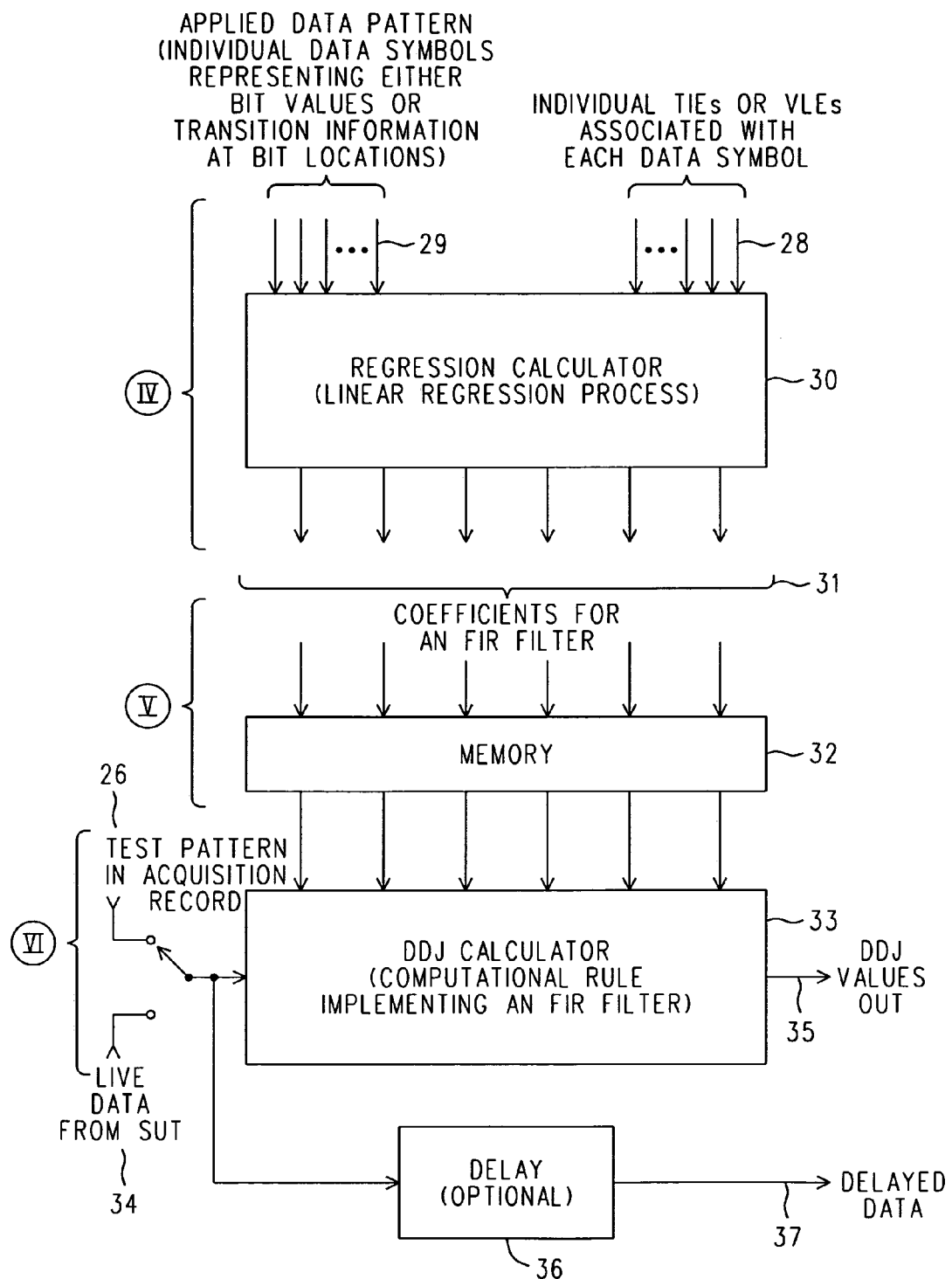

To conclude this discussion of the use of transition@position oriented Templates in place of a bit value@position oriented Template, we note that FIG. 4B shows that the inputs 29 to the Regression Calculator 30 are of the corresponding type, as well. So long as the nature of the regression is for linear relationships (which is what we expect will be typical), the overall regression technique remains the same in either case, even though there may be different numbers of terms involved. We also note that in either of the bit value or transition cases, the computational form (e.g., FIR filter) chosen for the DDJ Calculator has an effect on the requirements that the regression process must meet.

Finally, our example in FIG. 5 deals with TIE, and not VLE. If voltage jitter were at issue, then the situation would be largely the same, save that record 39 would be a VLE record, and the requirement for the bit location of interest to exhibit a transition would be absent (a signal need not exhibit a transition to present VLE, whereas it does to show TIE). METHOD OF FINDING DATA DEPENDENT TIMING AND VOLTAGE JITTER FOR DIFFERENT BITS IN AN ARBITRARY DIGITAL SIGNAL IN ACCORDANCE WITH SELECTED SURROUNDING BITS has some useful further explanation about voltage jitter that may be taken as applicable to this present case.

We claim:

1. A method of measuring timing Data Dependent Jitter for a digital signal in a System Under Test, comprising the steps of:
   (a) processing consecutively sampled values of an instance of a bit pattern in the digital signal to produce an Acquisition Record;
   (b) measuring times of occurrence of consecutive edges in the Acquisition Record to form a corresponding Original Time Interval Error Record;
   (c) specifying, for a current bit in the digital signal at which amounts of timing Data Dependent Jitter are to be associated, a collection of bit positions relative to the current bit and which may influence the value of timing Data Dependent Jitter occurring at the current bit;
   (d) traversing the Acquisition Record of Step (a) to produce an independent variable sequence whose elements are instances of a current bit's logic value and the logic values of that current bit's associated collection of relative bit positions of step (c);
   (e) traversing the Original Time Interval Error Record to find a dependent variable sequence of Time Interval Error values, each value of which is respectively associated with an instance of a current bit and its associated collection of relative bit positions of step (c);
   (f) subsequent to Steps (d) and (e), performing a regression to find coefficients for a computational model that produces the dependent variable sequence from the independent variable sequence; and
   (g) subsequent to step (f), outputting the coefficients found in step (f) and its associated computational model.

2. A method as in claim 1 further comprising the step (h) of populating the coefficients of a DDJ Calculator with the coefficients of step (f).

3. A method as in claim 2 wherein the DDJ Calculator has the computational form of a finite impulse response filter.

4. A method as in claim 1 further comprising the steps of:
   (h) populating the coefficients of a DDJ Calculator with the coefficients of step (f);
   (i) subsequent to step (h), operating the System Under Test with an arbitrary bit pattern as the bit pattern in the digital signal;
   (j) applying an instance of the arbitrary bit pattern measured from within the System Under Test to the input of the DDJ Calculator of step (h); and
   (k) computing with the DDJ Calculator values of DDJ for each bit in the arbitrary bit pattern.

5. A method as in claim 1 further comprising the steps of:
(h) populating the coefficients of a DDJ Calculator with the coefficients of step (f);
(i) subsequent to step (h), operating the System Under Test with a Pseudo Random Test Pattern as the bit pattern in the digital signal;
(j) applying an instance of the Pseudo Random Test Pattern measured from within the System Under Test to the input of the DDJ Calculator of step (h); and
(k) computing with the DDJ Calculator values of DDJ for each bit in the Pseudo Random Test Pattern.

6. A method as in claim 1 further comprising the steps of:
(h) populating the coefficients of a DDJ Calculator with the coefficients of step (f);
(i) subsequent to step (h), operating the System Under Test with a Work Pattern of actual live data as the bit pattern in the digital signal;
(j) applying an instance of the Work Pattern measured from within the System Under Test to the input of the DDJ Calculator of step (h); and
(k) computing with the DDJ Calculator values of DDJ for each bit in the Work Pattern.

7. A method of measuring voltage Data Dependent Jitter for a digital signal in a System Under Test, comprising the steps of:
(a) processing consecutively sampled values of an instance of a bit pattern in the digital signal to produce an Acquisition Record;
(b) measuring logical voltage error within consecutive bits in the Acquisition Record to form a corresponding Original Voltage Level Error Record;
(c) specifying, for a current bit in the digital signal at which amounts of voltage Data Dependent Jitter are to be associated, a collection of bit positions relative to the current bit and which may influence the value of voltage Data Dependent Jitter occurring at the current bit;
(d) traversing the Acquisition Record of Step (a) to produce an independent variable sequence whose elements are instances of a current bit's logic value and the logic values of that current bit's associated collection of relative bit positions of step (c);
(e) traversing the Original Voltage Level Error Record to find a dependent variable sequence of Voltage Level Error values, each value of which is respectively associated with an instance of a current bit and its associated collection of relative bit positions of step (c);
(f) subsequent to Steps (d) and (e), performing a regression to find coefficients for a computational model that produces the dependent variable sequence from the independent variable sequence; and
(g) subsequent to step (f), outputting the coefficients found in step (f) and its associated computational model.

8. A method as in claim 7 further comprising the step (h) of populating the coefficients of a DDJ Calculator with the coefficients of step (f).

9. A method as in claim 8 wherein the DDJ Calculator has the computational form of a finite impulse response filter.

10. A method as in claim 7 further comprising the steps of:
(h) populating the coefficients of a DDJ Calculator with the coefficients of step (f);
(i) subsequent to step (h), operating the System Under Test with an arbitrary bit pattern as the bit pattern in the digital signal;
(j) applying an instance of the arbitrary bit pattern measured from within the System Under Test to the input of the DDJ Calculator of step (h); and
(k) computing with the DDJ Calculator values of DDJ for each bit in the arbitrary bit pattern.

11. A method as in claim 7 further comprising the steps of:
(h) populating the coefficients of a DDJ Calculator with the coefficients of step (f);
(i) subsequent to step (h), operating the System Under Test with a Pseudo Random Test Pattern as the bit pattern in the digital signal;
(j) applying an instance of the Pseudo Random Test Pattern measured from within the System Under Test to the input of the DDJ Calculator of step (h); and
(k) computing with the DDJ Calculator values of DDJ for each bit in the Pseudo Random Test Pattern.

12. A method as in claim 7 further comprising the steps of:
(h) populating the coefficients of a DDJ Calculator with the coefficients of step (f);
(i) subsequent to step (h), operating the System Under Test with a Work Pattern of actual live data as the bit pattern in the digital signal;
(j) applying an instance of the Work Pattern measured from within the System Under Test to the input of the DDJ Calculator of step (h); and
(k) computing with the DDJ Calculator values of DDJ for each bit in the Work Pattern.

13. A method of measuring timing Data Dependent Jitter for a digital signal in a System Under Test, comprising the steps of:
(a) processing consecutively sampled values of an instance of a bit pattern in the digital signal to produce an Acquisition Record;
(b) measuring times of occurrence of consecutive edges in the Acquisition Record to form a corresponding Original Time Interval Error Record;
(c) specifying, for a current bit in the digital signal at which amounts of timing Data Dependent Jitter are to be associated, a collection of bit positions relative to the current bit and which may influence the value of timing Data Dependent Jitter occurring at the current bit;
(d) traversing the Acquisition Record of Step (a) to produce an independent variable sequence whose elements are instances of a current bit's transition value and the transition values of that current bit's associated collection of relative bit positions of step (c);
(e) traversing the Original Time Interval Error Record to find a dependent variable sequence of Time Interval Error values, each value of which is respectively associated with an instance of a current bit and its associated collection of relative bit positions of step (c);
(f) subsequent to Steps (d) and (e), performing a regression to find coefficients for a computational model that produces the dependent variable sequence from the independent variable sequence; and
(g) subsequent to step (f), outputting the coefficients found in step (f) and its associated computational model.

14. A method as in claim 13 further comprising the step (h) of populating the coefficients of a DDJ Calculator with the coefficients of step (f).

15. A method as in claim 14 wherein the DDJ Calculator has the computational form of a finite impulse response filter.

16. A method as in claim 13 further comprising the steps of:
- (h) populating the coefficients of a DDJ Calculator with the coefficients of step (f);
- (i) subsequent to step (h), operating the System Under Test with an arbitrary bit pattern as the bit pattern in the digital signal;
- (j) applying an instance of the arbitrary bit pattern measured from within the System Under Test to the input of the DDJ Calculator of step (h); and
- (k) computing with the DDJ Calculator values of DDJ for each bit in the arbitrary bit pattern.

17. A method as in claim 13 further comprising the steps of:
- (h) populating the coefficients of a DDJ Calculator with the coefficients of step (f);
- (i) subsequent to step (h), operating the System Under Test with a Pseudo Random Test Pattern as the bit pattern in the digital signal;
- (j) applying an instance of the Pseudo Random Test Pattern measured from within the System Under Test to the input of the DDJ Calculator of step (h); and
- (k) computing with the DDJ Calculator values of DDJ for each bit in the Pseudo Random Test Pattern.

18. A method as in claim 13 further comprising the steps of:
- (h) populating the coefficients of a DDJ Calculator with the coefficients of step (f);
- (i) subsequent to step (h), operating the System Under Test with a Work Pattern of actual live data as the bit pattern in the digital signal;
- (j) applying an instance of the Work Pattern measured from within the System Under Test to the input of the DDJ Calculator of step (h); and
- (k) computing with the DDJ Calculator values of DDJ for each bit in the Work Pattern.

19. A method of measuring voltage Data Dependent Jitter for a digital signal in a System Under Test, comprising the steps of:
- (a) processing consecutively sampled values of an instance of a bit pattern in the digital signal to produce an Acquisition Record;
- (b) measuring logical voltage error within consecutive bits in the Acquisition Record to form a corresponding Original Voltage Level Error Record;
- (c) specifying, for a current bit in the digital signal at which amounts of voltage Data Dependent Jitter are to be associated, a collection of bit positions relative to the current bit and which may influence the value of voltage Data Dependent Jitter occurring at the current bit;
- (d) traversing the Acquisition Record of Step (a) to produce an independent variable sequence whose elements are instances of a current bit's transition value and the transition values of that current bit's associated collection of relative bit positions of step (c);
- (e) traversing the Original Voltage Level Error Record to find a dependent variable sequence of voltage Level Error values, each value of which is respectively associated with an instance of a current bit and its associated collection of relative bit positions of step (c);
- (f) subsequent to Steps (d) and (e), performing a regression to find coefficients for a computational model that produces the dependent variable sequence from the independent variable sequence; and
- (g) subsequent to step (f), outputting the coefficients found in step (f) and its associated computational model.

20. A method as in claim 19 further comprising the step (h) of populating the coefficients of a DDJ Calculator with the coefficients of step (f).

21. A method as in claim 20 wherein the DDJ Calculator has the computational form of a finite impulse response filter.

22. A method as in claim 19 further comprising the steps of:
- (h) populating the coefficients of a DDJ Calculator with the coefficients of step (f);
- (i) subsequent to step h, operating the System Under Test with an arbitrary bit pattern as the bit pattern in the digital signal;
- (j) applying an instance of the arbitrary bit pattern measured from within the System Under Test to the input of the DDJ Calculator of step (h); and
- (k) computing with the DDJ Calculator values of DDJ for each bit in the arbitrary bit pattern.

23. A method as in claim 19 further comprising the steps of:
- (h) populating the coefficients of a DDJ Calculator with the coefficients of step (f);
- (i) subsequent to step (h), operating the System Under Test with a Pseudo Random Test Pattern as the bit pattern in the digital signal;
- (j) applying an instance of the Pseudo Random Test Pattern measured from within the System Under Test to the input of the DDJ Calculator of step (h); and
- (k) computing with the DDJ Calculator values of DDJ for each bit in the Pseudo Random Test Pattern.

24. A method as in claim 19 further comprising the steps of:
- (h) populating the coefficients of a DDJ Calculator with the coefficients of step (f);
- (i) subsequent to step (h), operating the System Under Test with a Work Pattern of actual live data as the bit pattern in the digital signal;
- (j) applying an instance of the Work Pattern measured from within the System Under Test to the input of the DDJ Calculator of step (h); and
- (k) computing with the DDJ Calculator values of DDJ for each bit in the Work Pattern.

* * * * *

UNITED STATES PATENT AND TRADEMARK OFFICE
CERTIFICATE OF CORRECTION

PATENT NO. : 7,248,982 B1 Page 1 of 1
APPLICATION NO. : 11/479414
DATED : July 24, 2007
INVENTOR(S) : Draving et al.

It is certified that error appears in the above-identified patent and that said Letters Patent is hereby corrected as shown below:

In column 18, line 2, in Claim 19, delete "voltage" and insert -- Voltage --, therefor.

In column 18, line 23, in Claim 22, delete "h," and insert -- (h), --, therefor.

Signed and Sealed this

Twenty-seventh Day of November, 2007

JON W. DUDAS
*Director of the United States Patent and Trademark Office*